US011955559B2

United States Patent
Matsushima et al.

(10) Patent No.: US 11,955,559 B2
(45) Date of Patent: Apr. 9, 2024

(54) THIN FILM TRANSISTOR, DISPLAY DEVICE, AND THIN FILM TRANSISTOR MANUFACTURING METHOD

(71) Applicant: SAKAI DISPLAY PRODUCTS CORPORATION, Sakai (JP)

(72) Inventors: Yoshiaki Matsushima, Sakai (JP); Shigeru Ishida, Sakai (JP); Ryohei Takakura, Sakai (JP); Satoru Utsugi, Sakai (JP); Nobutake Nodera, Sakai (JP); Takao Matsumoto, Sakai (JP); Satoshi Michinaka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 257 days.

(21) Appl. No.: 17/459,256

(22) Filed: Aug. 27, 2021

(65) Prior Publication Data

US 2021/0391475 A1 Dec. 16, 2021

Related U.S. Application Data

(62) Division of application No. 16/095,921, filed as application No. PCT/JP2016/062945 on Apr. 25, 2016, now abandoned.

(51) Int. Cl.
*H01L 29/786* (2006.01)
*G02F 1/1368* (2006.01)
(Continued)

(52) U.S. Cl.
CPC ...... *H01L 29/78678* (2013.01); *G02F 1/1368* (2013.01); *H01L 21/3086* (2013.01);
(Continued)

(58) Field of Classification Search
CPC ........... H01L 29/78678; H01L 21/3086; H01L 29/04; H01L 29/41733; H01L 29/42384;
(Continued)

(56) References Cited

U.S. PATENT DOCUMENTS 5,474,941 A * 12/1995 Mitani .............. H01L 29/66757
257/E21.414
5,637,519 A 6/1997 Tsai et al.
(Continued)

FOREIGN PATENT DOCUMENTS

| CN | 101626036 A | 1/2010 |
|---|---|---|
| CN | 101656270 A | 2/2010 |

(Continued)

OTHER PUBLICATIONS

Non-Final Office Action dated Mar. 11, 2020 for U.S. Appl. No. 16/095,921.

(Continued)

*Primary Examiner* — Bitew A Dinke
(74) *Attorney, Agent, or Firm* — ScienBiziP, P.C.

(57) ABSTRACT

Provided are a thin film transistor, a display device, and a thin film transistor manufacturing method, in which variation in characteristics is small. The present invention is provided with: a gate electrode formed on a substrate; a gate insulation film formed so as to cover the gate electrode; a semiconductor layer which is formed on the upper side of the gate insulation film and which includes a polysilicon layer disposed, in a plan view, inside a region defined by the gate electrode; an etching stopper layer disposed on the upper side of the polysilicon layer; and a source electrode and a drain electrode provided on the semiconductor layer so as to be separated from each other, wherein the polysilicon layer has first and second regions which are not covered with the etching stopper layer, and a part of the source electrode
(Continued)

exists above the first region and a part of the drain electrode exists above the second region.

17 Claims, 8 Drawing Sheets

(51) Int. Cl.
*H01L 21/308* (2006.01)
*H01L 29/04* (2006.01)
*H01L 29/417* (2006.01)
*H01L 29/423* (2006.01)
*H01L 29/66* (2006.01)
*H01L 27/12* (2006.01)

(52) U.S. Cl.
CPC ........ *H01L 29/04* (2013.01); *H01L 29/41733* (2013.01); *H01L 29/42384* (2013.01); *H01L 29/66765* (2013.01); *H01L 29/78618* (2013.01); *H01L 29/78669* (2013.01); *H01L 29/78696* (2013.01); *G02F 2202/103* (2013.01); *G02F 2202/104* (2013.01); *H01L 27/124* (2013.01)

(58) Field of Classification Search
CPC ......... H01L 29/66765; H01L 29/78618; H01L 29/78669; H01L 29/78696; H01L 27/124; G02F 1/1368; G02F 2202/103; G02F 2202/104
See application file for complete search history.

(56) References Cited

U.S. PATENT DOCUMENTS

| | | | |
|---|---|---|---|
| 6,031,248 A * | 2/2000 | Mei | H01L 27/14643 257/69 |
| 6,051,827 A * | 4/2000 | Mei | H01L 27/14609 250/214 R |
| 6,278,504 B1 | 8/2001 | Sung | |
| 6,855,954 B1 | 2/2005 | Zhang | |
| 7,320,905 B2 * | 1/2008 | Yamazaki | H01L 27/1274 438/164 |
| 7,338,845 B2 | 3/2008 | Kuo | |
| 8,178,884 B2 | 5/2012 | Ha et al. | |
| 8,193,535 B2 | 6/2012 | Ha et al. | |
| 8,450,735 B2 | 5/2013 | Noda | |
| 8,466,462 B2 | 6/2013 | Chung et al. | |
| 8,492,212 B2 * | 7/2013 | Kuniyoshi | H01L 29/78621 438/160 |
| 8,728,862 B2 | 5/2014 | Ha et al. | |
| 9,698,173 B2 | 7/2017 | Wei et al. | |
| 9,929,274 B2 | 3/2018 | Hayashi et al. | |
| 10,559,600 B2 * | 2/2020 | Sugawara | H01L 27/1285 |
| 10,770,483 B2 * | 9/2020 | Sugawara | H01L 29/7869 |
| 11,133,333 B2 * | 9/2021 | Sugawara | H01L 29/78621 |
| 2001/0038099 A1 | 11/2001 | Yamazaki et al. | |
| 2005/0218403 A1 | 10/2005 | Kuo | |
| 2006/0033106 A1 | 2/2006 | Seo et al. | |
| 2006/0199316 A1 * | 9/2006 | Kuo | H01L 29/78621 257/E21.414 |
| 2007/0019123 A1 * | 1/2007 | Seo | H01L 27/1288 257/E21.133 |
| 2007/0134856 A1 * | 6/2007 | Jang | H01L 29/78678 257/E29.294 |
| 2007/0284580 A1 * | 12/2007 | Lim | H01L 29/66765 257/E21.414 |
| 2009/0189160 A1 * | 7/2009 | Ahn | H01L 29/66765 313/503 |
| 2009/0289258 A1 * | 11/2009 | Kim | H01L 29/78669 257/E21.414 |
| 2009/0315034 A1 * | 12/2009 | Lee | H01L 27/1285 257/E29.294 |
| 2010/0006833 A1 | 1/2010 | Ha et al. | |
| 2010/0025677 A1 | 2/2010 | Yamazaki et al. | |
| 2010/0044699 A1 * | 2/2010 | Chung | H01L 29/78618 257/43 |
| 2010/0117090 A1 | 5/2010 | Roh et al. | |
| 2010/0193779 A1 * | 8/2010 | Lee | H01L 29/66765 257/E21.414 |
| 2010/0244038 A1 * | 9/2010 | Ro | H01L 21/02532 257/E21.414 |
| 2010/0301339 A1 * | 12/2010 | Morimura | H01L 21/02422 257/E21.414 |
| 2011/0049518 A1 | 3/2011 | Noda | |
| 2011/0079780 A1 | 4/2011 | Yamayoshi et al. | |
| 2011/0124162 A1 | 5/2011 | Lee et al. | |
| 2011/0186845 A1 * | 8/2011 | Yamayoshi | H01L 29/66765 257/E29.101 |
| 2011/0260157 A1 * | 10/2011 | Yano | H01L 29/872 257/E29.296 |
| 2012/0033152 A1 | 2/2012 | Ha et al. | |
| 2012/0220077 A1 | 8/2012 | Ha et al. | |
| 2013/0153028 A1 | 6/2013 | Hayashi et al. | |
| 2013/0193431 A1 * | 8/2013 | Yamazaki | H01L 29/04 438/151 |
| 2014/0048807 A1 * | 2/2014 | Kanegae | H01L 29/6675 438/158 |
| 2016/0056184 A1 | 2/2016 | Wei et al. | |
| 2017/0104103 A1 | 4/2017 | Hayashi et al. | |
| 2017/0162709 A1 * | 6/2017 | Nodera | H01L 29/78696 |
| 2017/0236948 A1 * | 8/2017 | Mizumura | H01L 29/66765 257/66 |
| 2018/0061661 A1 | 3/2018 | Mizumura | |
| 2018/0097120 A1 * | 4/2018 | Ishida | H01L 29/78672 |
| 2018/0197998 A1 * | 7/2018 | Bai | H01L 27/1229 |
| 2018/0212065 A1 * | 7/2018 | Matsushima | H01L 29/78669 |
| 2019/0035629 A1 * | 1/2019 | Mizumura | H01L 21/02678 |
| 2020/0006394 A1 | 1/2020 | Sugawara et al. | |
| 2020/0006396 A1 | 1/2020 | Sugawara et al. | |

FOREIGN PATENT DOCUMENTS

| | | |
|---|---|---|
| CN | 103081078 A | 5/2013 |
| JP | H09-203908 A | 8/1997 |
| JP | 4109266 B2 | 7/2008 |
| JP | 2011-077509 A | 4/2011 |
| KR | 20080047773 A | 5/2008 |

OTHER PUBLICATIONS

Final Office Action dated Jun. 29, 2020 for U.S. Appl. No. 16/095,921.
Advisory Action dated Oct. 13, 2020 for U.S. Appl. No. 16/095,921.
Non-Final Office Action dated Dec. 15, 2020 for U.S. Appl. No. 16/095,921.
Final Office Action dated Apr. 30, 2021 for U.S. Appl. No. 16/095,921.
Advisory Action dated Jul. 12, 2021 for U.S. Appl. No. 16/095,921.
Advisory Action dated Jul. 30, 2021 for U.S. Appl. No. 16/095,921.

* cited by examiner

THIN FILM TRANSISTOR, DISPLAY DEVICE, AND THIN FILM TRANSISTOR MANUFACTURING METHOD

TECHNICAL FIELD

The present invention relates to a bottom-gate thin film transistor, a display apparatus, and a method for manufacturing a thin film transistor.

BACKGROUND ART

Thin film transistors (TFTs) are for example widely used as switching elements for pixels in display apparatuses such as liquid-crystal displays and organic electro-luminescence (EL) displays.

The thin film transistors have a configuration in which a gate electrode, an insulating layer, a semiconductor layer (a channel layer), a source electrode, and a drain electrode are formed on a substrate. In particular, bottom-gate thin film transistors are characterized in that the gate electrode is located closer to the substrate than the channel layer.

CITATION LIST

Patent Literature

Patent Literature 1: Japanese Patent No. 4109266

SUMMARY OF INVENTION

Technical Problem

Manufacturing of bottom-gate thin film transistors as channel-etched thin film transistors involves the following problem. That is, etching of channel layers, which is performed in a process of the manufacturing, makes it difficult to control a remaining film amount in the channel layers, and consequently there is relatively great variation in characteristics among the thus manufactured thin film transistors.

The present invention has been made in view of the circumstances described above, and an object thereof is to provide thin film transistors that show little characteristic variation, a display apparatus including such thin film transistors, and a method for manufacturing such thin film transistors.

Solution to Problem

A thin film transistor according to the present application includes a gate electrode, a gate insulating film, a semiconductor layer, an etch stop layer, and a source electrode and a drain electrode. The gate electrode is disposed on a substrate. The gate insulating film covers the gate electrode. The semiconductor layer is disposed on the gate insulating film. The semiconductor layer includes a polysilicon film located within a range defined by the gate electrode in a plan view. The etch stop layer is disposed on the polysilicon film. The source electrode and the drain electrode are disposed on the semiconductor layer with a space therebetween. The polysilicon film has first and second regions that are not covered by the etch stop layer. A portion of the source electrode is located over the first region, and a portion of the drain electrode is located over the second region.

A display apparatus according to the present application includes a plurality of display elements and a plurality of thin film transistors that select or drive the respective display elements. Each of the thin film transistors is the thin film transistor according to the present application described above. Each of the thin film transistors selects or drives the corresponding display element when the display element is to be displayed.

A method for manufacturing a thin film transistor according to an aspect of the present application includes: forming a gate electrode on a substrate; forming a gate insulating film to cover the gate electrode; forming a semiconductor layer including an amorphous silicon film on the gate insulating film; forming an etch stop layer on the semiconductor layer; forming a polysilicon film within a range defined by the gate electrode in a plan view by irradiating a portion of the amorphous silicon film with energy beams from above through the etch stop layer; removing portions of the etch stop layer so that the polysilicon film has first and second regions that are not covered by the etch stop layer; and forming a source electrode and a drain electrode on the semiconductor layer with a space therebetween so that a portion of one of the source electrode and the drain electrode is located over the first region, and a portion of another of the source electrode and the drain electrode is located over the second region.

A method for manufacturing a thin film transistor according to another aspect of the present application includes: forming a gate electrode on a substrate; forming a gate insulating film to cover the gate electrode; forming a semiconductor layer including an amorphous silicon film on the gate insulating film; forming a polysilicon film within a range defined by the gate electrode in a plan view by irradiating a portion of the amorphous silicon film with energy beams; forming an etch stop layer on the semiconductor layer; removing portions of the etch stop layer so that the polysilicon film has first and second regions that are not covered by the etch stop layer; and forming a source electrode and a drain electrode on the semiconductor layer with a space therebetween so that a portion of one of the source electrode and the drain electrode is located over the first region, and a portion of another of the source electrode and the drain electrode is located over the second region.

Advantageous Effects of Invention

The present invention allows control of a remaining film amount in channel layers and reduction in characteristic variation.

DESCRIPTION OF EMBODIMENTS

The following describes embodiments of the present invention in detail based on the drawings.

Embodiment 1

Figure 1:
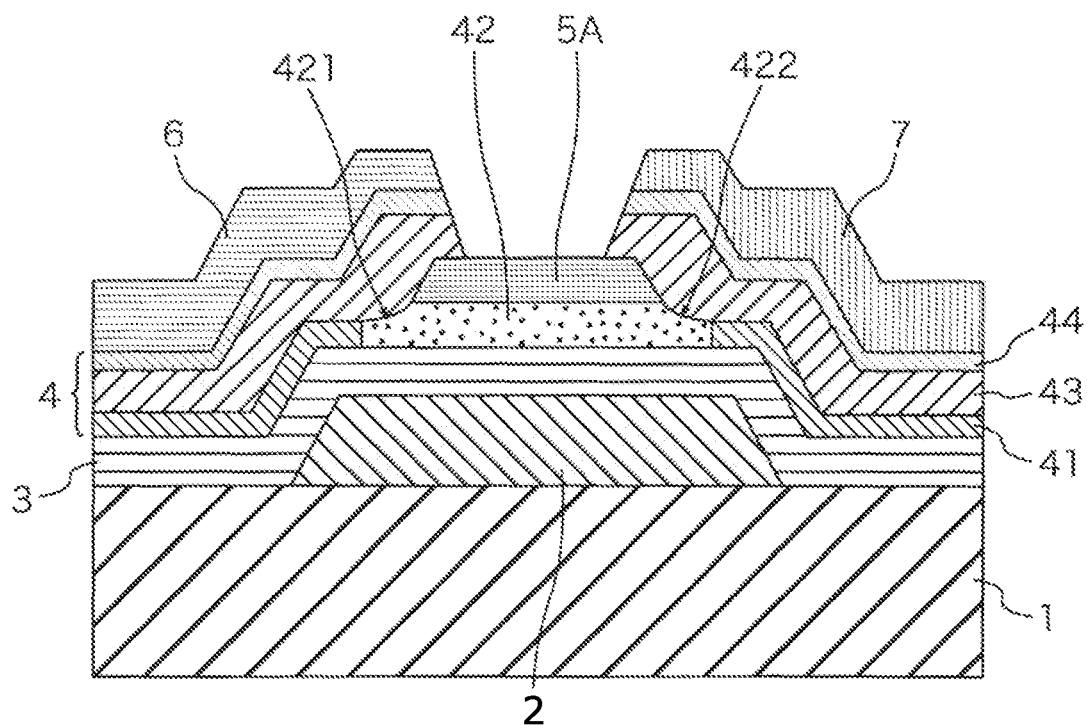
FIG. 1 is a cross-sectional view schematically illustrating a configuration of a thin film transistor according to Embodiment 1.
Figure 2:
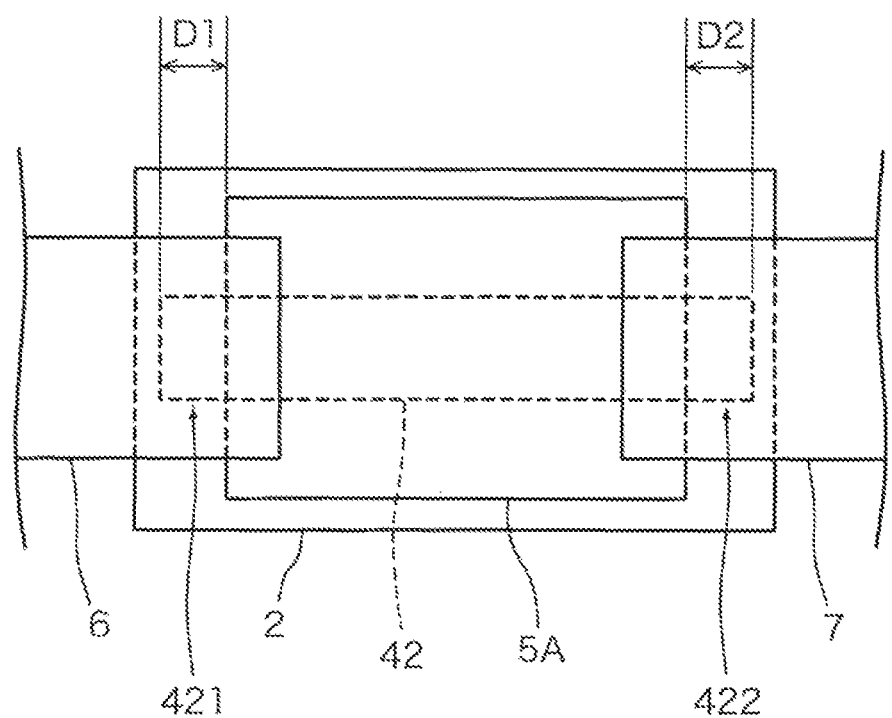
FIG. 2 is a plan view schematically illustrating a configuration of main elements of the thin film transistor according to Embodiment 1.

FIG. 1 is a cross-sectional view schematically illustrating a configuration of a thin film transistor according to Embodiment 1. FIG. 2 is a plan view schematically illustrating a configuration of main elements of the thin film transistor. The thin film transistor according to Embodiment 1 includes a gate electrode 2, a gate insulating film 3, a semiconductor layer (a channel layer) 4, an etch stop layer 5A, a source electrode 6, and a drain electrode 7. Note that FIG. 2, which is a plan view, illustrates a positional relationship between the gate electrode 2, a polysilicon film 42, the etch stop layer 5A, the source electrode 6, and the drain electrode 7, and does not show other elements of configuration of the thin film transistor in order to simplify the drawing.

The gate electrode 2 is formed on a surface of a substrate 1 by patterning. Examples of materials that can be used for formation of the gate electrode 2 include metals such as Al, Mo, Cr, Ta, Cu, and Ti; alloys containing at least one of the metals as a main component; and metal oxides. An insulating substrate such as a glass substrate is for example used as the substrate 1.

The gate insulating film 3 is formed so as to cover the gate electrode 2 on the substrate 1. The gate insulating film 3 may be an insulating film of an organic material or an insulating film of an inorganic material. For example, tetraethyl orthosilicate (TEOS) can be used for the insulating film of an organic material. For example, $SiO_2$, $SiO_2$/SiN, SiN, and SiON can be used for the insulating film of an inorganic material.

The semiconductor layer 4 includes a first amorphous silicon film 41, the polysilicon film 42, a second amorphous silicon film 43, and an $n^+$ silicon film 44. The first amorphous silicon film 41 is formed on the gate insulating film 3 and has a thickness of at least 250 Å. The polysilicon film 42 is formed on the gate insulating film 3 as well as the first amorphous silicon film 41 and resides in the same layer as the first amorphous silicon film 41. The polysilicon film 42 contains polycrystalline silicon, microcrystalline silicon, which has a smaller grain size than the polycrystalline silicon, or monocrystalline silicon. In a plan view of the present embodiment, the polysilicon film 42 is located within a range defined by the gate electrode 2 (a range defined by a perimeter of the gate electrode 2, which in an example illustrated in FIG. 2 is a rectangular region).

The second amorphous silicon film 43 is formed on the first amorphous silicon film 41 and the polysilicon film 42, and has a thickness of approximately 500 to 900 Å. The $n^+$ silicon film 44 is a semiconductor film containing a high concentration of impurity such as phosphorus and arsenic. The $n^+$ silicon film 44 is formed on the second amorphous silicon film 43.

The etch stop layer 5A is an insular film formed on the polysilicon film 42. The etch stop layer 5A can for example be formed using a material such as $SiO_2$. According to the present embodiment, the polysilicon film 42 extends beyond a range of the etch stop layer 5A, having regions 421 and 422 that are not covered by the etch stop layer 5A. That is, in a plan view, the regions 421 and 422 of the polysilicon film 42 are located outside a range defined by the etch stop layer 5A (a range defined by a perimeter of the etch stop layer 5A). The regions 421 and 422 protrude from the etch stop layer 5A by protrusion lengths D1 and D2, respectively, and the protrusion lengths D1 and D2 are preferably each at least 3 μm. Note that the protrusion length D1 does not have to be equal to the protrusion length D2 so long as the protrusion lengths D1 and D2 are each at least 3 μm. The protrusion lengths D1 and D2 may be each less than 3 μm. In such a configuration, the protrusion length D1 is preferably equal to the protrusion length D2.

The source electrode 6 and the drain electrode 7 each having a desired pattern are formed on the semiconductor layer 4 (the $n^+$ silicon film 44) with a space therebetween. Examples of materials that can be used for formation of the source electrode 6 and the drain electrode 7 include metals such as Al, Mo, Cr, Ta, Cu, and Ti; alloys containing at least one of the metals as a main component; and metal oxides.

According to the present embodiment, the source electrode 6 and the drain electrode 7 are respectively located toward the region 421 (a first region) and the region 422 (a second region) that are not covered by the etch stop layer 5A of the polysilicon film 42. In other words, a portion of the source electrode 6 is located over the region 421, and a portion of the drain electrode 7 is located over the region 422.

Figure 3:
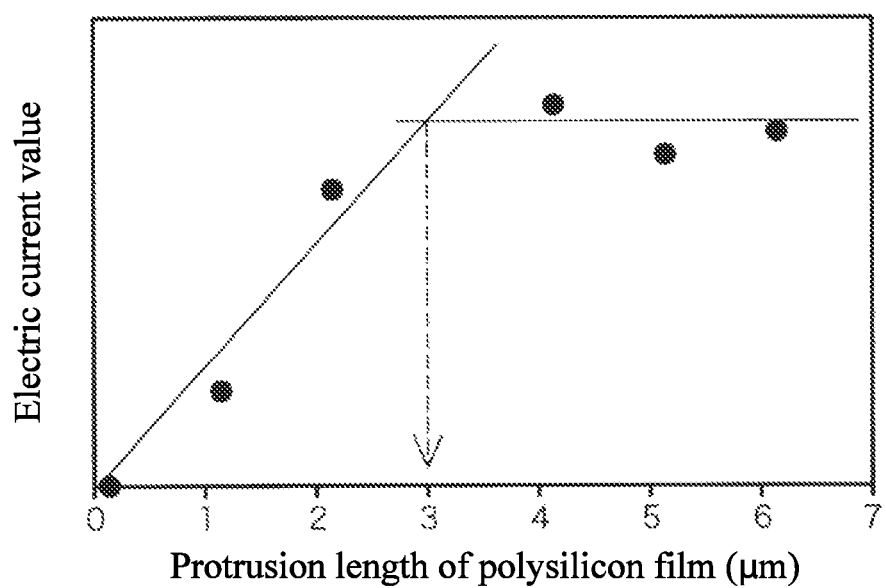
FIG. 3 is a graph illustrating characteristics of the thin film transistor.

FIG. 3 is a graph illustrating characteristics of the thin film transistor. The graph shown in FIG. 3 illustrates a relationship between the protrusion lengths D1 and D2 by which the polysilicon film 42 protrudes from the etch stop layer 5A and a value of electric current that flows between the source electrode 6 and the drain electrode 7 when the thin film transistor is on. The protrusion length D1 at the source electrode 6 is equal to the protrusion length D2 at the drain electrode 7. The horizontal axis of the graph shown in FIG. 3 represents one of the protrusion lengths D1 (D2), and the vertical axis represents the electric current value between the source electrode 6 and the drain electrode 7 when the thin film transistor is on.

The graph shown in FIG. 3 indicates that almost no electric current flows between the source electrode 6 and the drain electrode 7 in a configuration in which the polysilicon film 42 barely extends beyond the range of the etch stop layer 5A, that is, in a configuration in which the protrusion lengths D1 and D2 of the polysilicon film 42 are each substantially zero.

By contrast, electric current flows between the source electrode 6 and the drain electrode 7 when the thin film transistor is on as long as the polysilicon film 42 extends beyond the range of the etch stop layer 5A, that is, as long as the protrusion lengths D1 and D2 of the polysilicon film 42 are each a finite length.

The value of the electric current that flows between the source electrode 6 and the drain electrode 7 when the thin film transistor is on is proportional to the protrusion lengths D1 and D2 on condition that the protrusion lengths D1 and D2 of the polysilicon film 42 are each less than 3 μm. That is, in a configuration in which the protrusion lengths D1 and D2 are each less than 3 μm but the protrusion lengths D1 and D2 are different from each other, the value of the electric current that flows from the source electrode 6 to the drain electrode 7 through the semiconductor layer 4 differs from the value of the electric current that flows from the drain electrode 7 to the source electrode 6, which may cause characteristic variation among thin film transistors. The protrusion lengths D1 and D2 are therefore preferably equal to each other in a configuration in which the protrusion lengths D1 and D2 of the polysilicon film 42 are each less than 3 μm.

The value of the electric current that flows between the source electrode 6 and the drain electrode 7 is approximately constant without dependence on the protrusion lengths D1 and D2 on condition that the protrusion lengths D1 and D2 of the polysilicon film 42 are each greater than or equal to 3 μm. Therefore, the protrusion lengths D1 and D2 do not have to be equal to each other in a configuration in which the protrusion lengths D1 and D2 of the polysilicon film 42 are each greater than or equal to 3 μm.

FIGS. 4A to 4D are cross-sectional views schematically illustrating a manufacturing method of the thin film transistor according to Embodiment 1. First, a metal film is deposited by sputtering on the surface of the insulating substrate 1 such as a glass substrate using, as a material, a metal such as Al, Mo, Cr, Ta, Cu, and Ti, an alloy containing at least one of the metals as a main component, or a metal oxide. The gate electrode 2 is formed by patterning through photolithography with a photomask, dry etching of the metal film, photoresist removal, and washing.

Next, a film is deposited by chemical vapor deposition (CVD) using a material such as $SiO_2$ and SiN to form the gate insulating film 3 so as to cover the gate electrode 2 on the substrate 1.

Figure 4A:
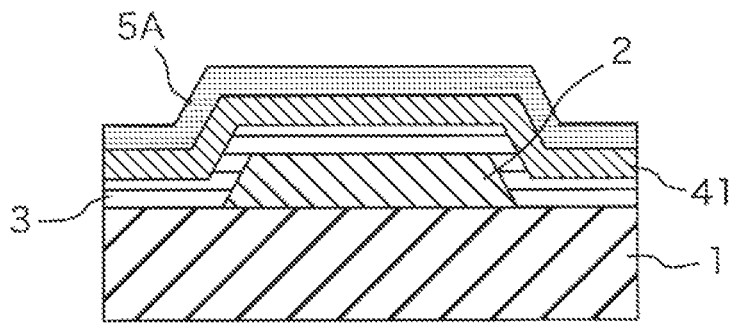
FIGS. 4A to 4D are cross-sectional views schematically illustrating a manufacturing method of the thin film transistor according to Embodiment 1.

Next, an amorphous silicon film having a thickness of approximately 500 to 700 Å is deposited by CVD to form the first amorphous silicon film 41 as an upper layer of the gate insulating film 3. Also, an $SiO_2$ film having a thickness of approximately 500 to 1,000 Å is deposited by CVD to form the etch stop layer 5A as an upper layer of the first amorphous silicon film 41. FIG. 4A illustrates a phase in which the etch stop layer 5A has been formed.

Figure 4B:
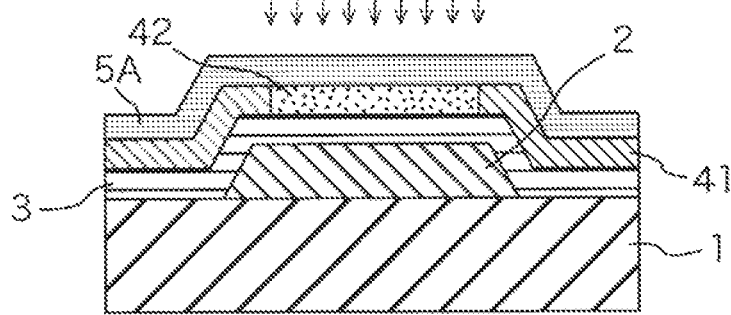

Next, dehydrogenation is caused to give a hydrogen concentration of no greater than 2% in the first amorphous silicon film 41, and annealing is performed on the first amorphous silicon film 41 by irradiation within the range defined by the gate electrode 2 in a plan view with laser light (for example, energy beams such as an excimer laser) from above through the etch stop layer 5A. As a result of the annealing, a portion of amorphous silicon in the first amorphous silicon film 41 turns polycrystalline silicon to form the polysilicon film 42 in the same layer as the first amorphous silicon film 41. FIG. 4B illustrates a phase in which the polysilicon film 42 has been formed.

Figure 4C:
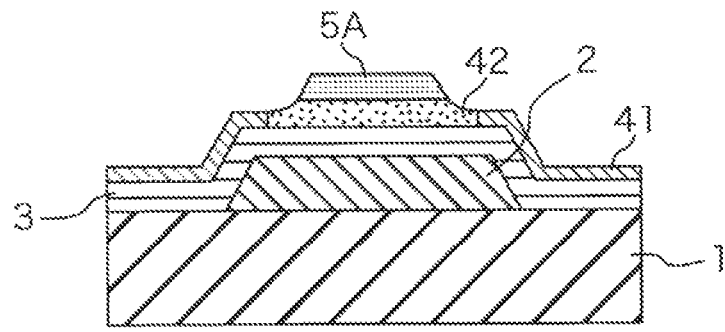

Next, the etch stop layer 5A is formed insular through photolithography with a photomask, dry etching of the etch stop layer 5A, photoresist removal, and washing. The photolithography with a photomask is carried out and dry etching of the first amorphous silicon film 41 is also carried out so that the thickness of the first amorphous silicon film 41 is at least 250 Å and the polysilicon film 42 has regions that are not covered by the etch stop layer 5A (the polysilicon film 42 extends beyond the range of the etch stop layer 5A, according to the present embodiment). FIG. 4C illustrates a phase in which the insular etch stop layer 5A has been formed.

Next, an amorphous silicon film having a thickness of approximately 500 to 900 Å is deposited by CVD to form the second amorphous silicon film 43. Also, an amorphous silicon film containing a high concentration of impurity such as phosphorus and arsenic is deposited by CVD to form the $n^+$ silicon film 44 as an upper layer of the second amorphous silicon film 43.

Figure 4D:
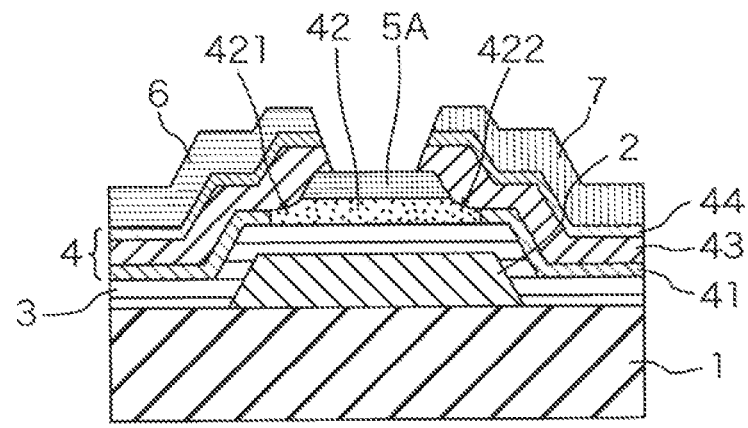

Next, a metal film is deposited by sputtering using, as a material, a metal such as Al, Mo, Cr, Ta, Cu, and Ti, an alloy containing at least one of the metals as a main component, or a metal oxide. The source electrode 6 and the drain electrode 7 are formed as an upper layer of the semiconductor layer 4 by patterning through photolithography with a photomask, dry etching of the metal film, photoresist removal, and washing. The photolithography with a photomask and the dry etching of the metal film are carried out so that the source electrode 6 and the drain electrode 7 in the upper layer of the semiconductor layer 4 are spaced, and the source electrode 6 and the drain electrode 7 are respectively located toward the region 421 and the region 422 that are not covered by the etch stop layer 5A of the polysilicon film 42. FIG. 4D illustrates a phase in which the source electrode 6 and the drain electrode 7 have been formed.

In order to apply the thin film transistor according to Embodiment 1 to a liquid-crystal display apparatus as a switching element, a passivation film, an organic film, and a pixel electrode are formed in order as upper layers of the source electrode 6 and the drain electrode 7.

The passivation film is for example formed as an upper layer of the source electrode 6 and the drain electrode 7 by CVD using a material such as SiN. The organic film is formed as an upper layer of the passivation film using a material such as JAS including acrylic resin. Thereafter, a contact hole for the drain electrode 7 is formed by patterning through photolithography, dry etching, photoresist removal, and washing. Also, an indium tin oxide (ITO) film is deposited as an upper layer of the organic layer by sputtering and patterned to form the pixel electrode.

As described above, according to Embodiment 1, the etch stop layer 5A provided as the upper layer of the polysilicon film 42 prevents the thickness of the polysilicon film 42 from being reduced due to a process such as the etching in the patterning for the source electrode 6 and the drain electrode 7. That is, according to Embodiment 1, it is possible to control the film thickness in a channel section. Accordingly, it is possible to manufacture thin film transistors that show little characteristic variation even by a low temperature poly-silicon (LTPS) process that leaves smaller areas of films having stable characteristics.

Embodiment 2

Embodiment 1 has been described referring to a configuration in which the insular etch stop layer 5A is provided as the upper layer of the polysilicon film 42. However, the etch stop layer does not have to be an insular layer.

Embodiment 2 will be described referring to a configuration in which an etch stop layer having a contact hole structure is provided as the upper layer of the polysilicon film 42.

Figure 5:
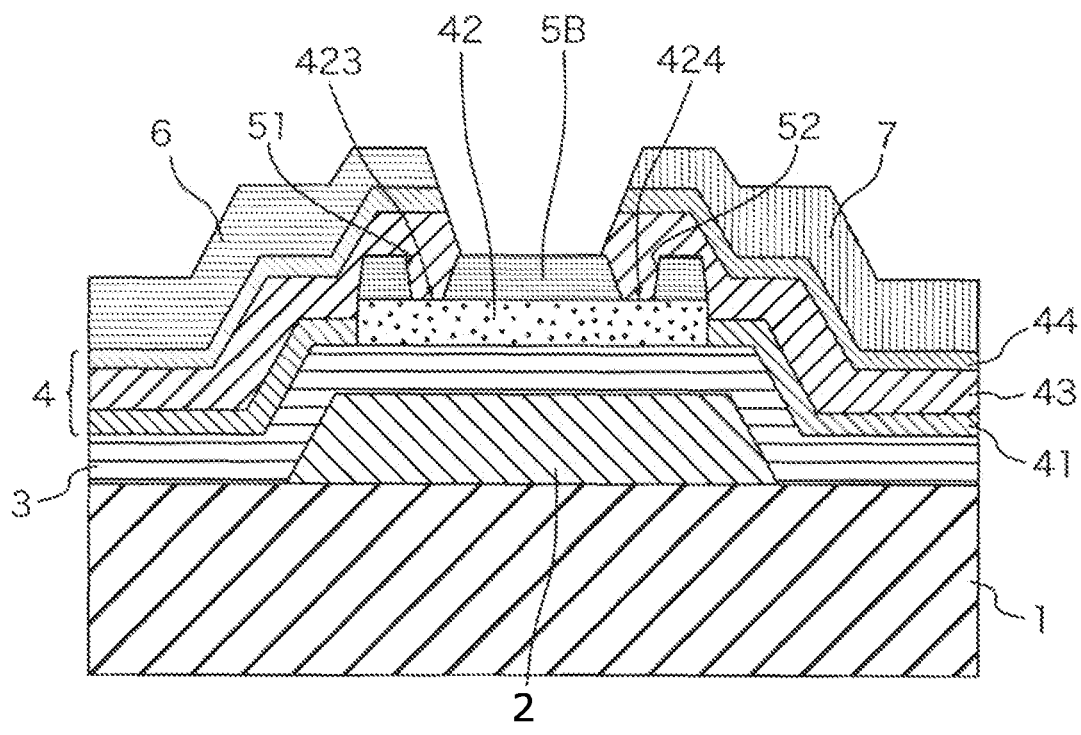
FIG. 5 is a cross-sectional view schematically illustrating a configuration of a thin film transistor according to Embodiment 2.
Figure 6:
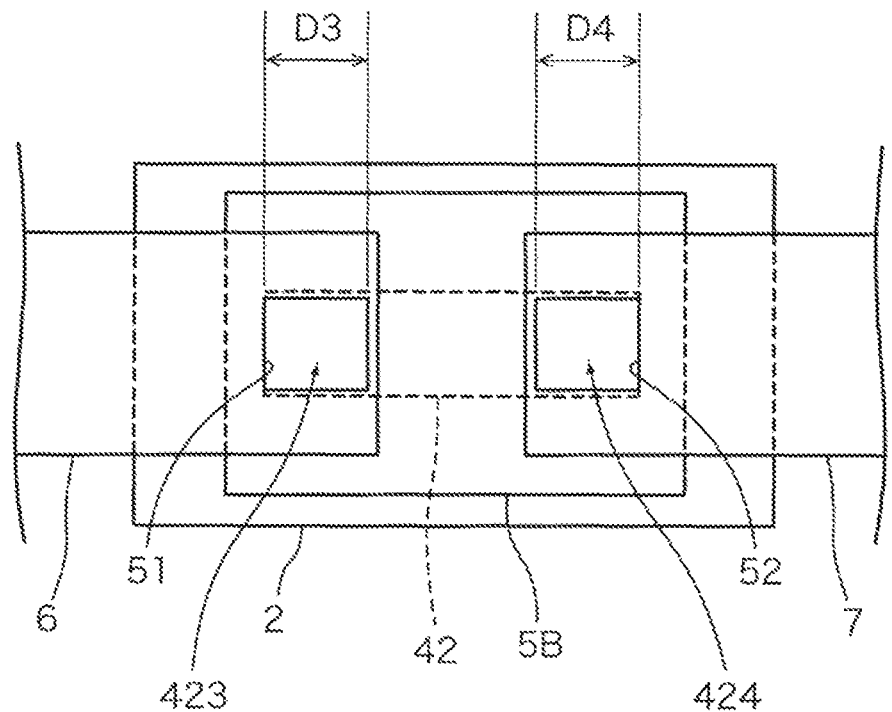
FIG. 6 is a plan view schematically illustrating a configuration of main elements of the thin film transistor according to Embodiment 2.

FIG. 5 is a cross-sectional view schematically illustrating a configuration of a thin film transistor according to Embodiment 2. FIG. 6 is a plan view schematically illustrating a configuration of main elements of the thin film transistor according to Embodiment 2. The thin film transistor according to Embodiment 2 includes the gate electrode 2, the gate insulating film 3, the semiconductor layer (the channel layer) 4, an etch stop layer 5B, the source electrode 6, and the drain electrode 7. Note that FIG. 6, which is a plan view, illustrates a positional relationship between the gate electrode 2, the polysilicon film 42, the etch stop layer 5B, the source electrode 6, and the drain electrode 7, and does not show other elements of configuration of the thin film transistor in order to simplify the drawing.

The substrate 1 is for example a glass substrate. The gate electrode 2 is formed on the surface of the substrate 1 by patterning. Examples of materials that can be used for formation of the gate electrode 2 include metals such as Al, Mo, Cr, Ta, Cu, and Ti; alloys containing at least one of the metals as a main component; and metal oxides.

The gate insulating film 3 is formed so as to cover the gate electrode 2 on the substrate 1. The gate insulating film 3 may be an insulating film of an organic material or an insulating film of an inorganic material. For example, TEOS can be used for the insulating film of an organic material. For example, $SiO_2$, $SiO_2/SiN$, SiN, and SiON can be used for the insulating film of an inorganic material.

The semiconductor layer 4 includes the first amorphous silicon film 41, the polysilicon film 42, the second amorphous silicon film 43, and the $n^+$ silicon film 44. The first amorphous silicon film 41 is formed on the gate insulating film 3 and has a thickness of at least 250 Å. The polysilicon film 42 is formed on the gate insulating film 3 as well as the first amorphous silicon film 41 and resides in the same layer as the first amorphous silicon film 41. The polysilicon film 42 contains polycrystalline silicon, microcrystalline silicon, which has a smaller grain size than the polycrystalline silicon, or monocrystalline silicon. In a plan view of the present embodiment, the polysilicon film 42 is located within the range defined by the gate electrode 2 (a rectangular region in an example illustrated in FIG. 6). As in Embodiment 1, the polysilicon film 42 according to Embodiment 2 is formed by partially performing annealing on the first amorphous silicon film 41 by irradiation within the range defined by the gate electrode 2 in a plan view with laser light (for example, energy beams such as from an excimer laser).

The second amorphous silicon film 43 is formed on the first amorphous silicon film 41 and the polysilicon film 42, and has a thickness of approximately 500 to 900 Å. The $n^+$ silicon film 44 is a semiconductor film containing a high concentration of impurity such as phosphorus and arsenic. The $n^+$ silicon film 44 is formed on the second amorphous silicon film 43.

The etch stop layer 5B having contact holes 51 and 52 is formed on the polysilicon film 42. The etch stop layer 5B is for example formed by CVD using a material such as $SiO_2$. The contact holes 51 and 52 of the etch stop layer 5B are formed through processes such as photolithography with a photomask and dry etching of the etch stop layer 5B.

The polysilicon film 42 resides right under the etch stop layer 5B. Since the etch stop layer 5B has the contact holes 51 and 52, the polysilicon film 42 has regions 423 and 424 that are not covered by the etch stop layer 5B. That is, the regions 423 and 424 of the polysilicon film 42 are located within a range defined by the etch stop layer 5B (a range defined by a perimeter of the etch stop layer 5B) in a plan view. Preferably, lengths D3 and D4 of the respective regions 423 and 424 in a direction in which the source electrode 6 and the drain electrode 7 are spaced are each at least 3 μm. Note that the length D3 does not have to be equal to the length D4 so long as the lengths D3 and D4 are each at least 3 μm. The lengths D3 and D4 may be each less than 3 μm. In such a configuration, the length D3 is preferably equal to the length D4.

The source electrode 6 and the drain electrode 7 each having a desired pattern are formed on the semiconductor layer 4 (the $n^+$ silicon film 44) with a space therebetween. Examples of materials that can be used for formation of the source electrode 6 and the drain electrode 7 include metals such as Al, Mo, Cr, Ta, Cu, and Ti; alloys containing at least one of the metals as a main component; and metal oxides.

According to the present embodiment, the source electrode 6 and the drain electrode 7 are respectively located toward the region 423 (the first region) and the region 424 (the second region) that are not covered by the etch stop layer 5B of the polysilicon film 42. In other words, a portion of the source electrode 6 is located over the region 423, and a portion of the drain electrode 7 is located over the region 424.

A manufacturing method of the thin film transistor according to Embodiment 2 is similar to the manufacturing method according to Embodiment 1. According to Embodiment 2, the etch stop layer 5B provided as the upper layer of the polysilicon film 42 prevents the thickness of the polysilicon film 42 from being reduced due to a process such as the etching in the patterning for the source electrode 6 and the drain electrode 7. That is, it is possible to control the film thickness in the channel section. Accordingly, it is possible to manufacture thin film transistors that show little characteristic variation even by an LTPS process that leaves smaller areas of films having stable characteristics.

Embodiment 3

Embodiment 1 has a configuration in which the polysilicon film 42 is formed by partially irradiating the first amorphous silicon film 41 with laser light after the etch stop layer 5A has been formed. However, the irradiation of the first amorphous silicon film 41 with laser light may be performed before the etch stop layer 5A is formed.

Embodiment 3 will be described referring to a method in which the polysilicon film 42 is formed by partially irradiating the first amorphous silicon film 41 with laser light before the etch stop layer 5A is formed.

Figure 7A:
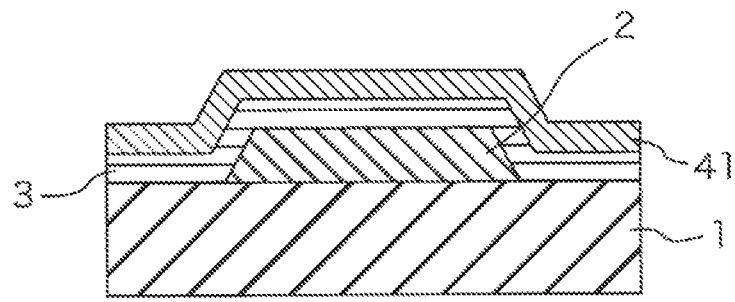
FIGS. 7A to 7D are cross-sectional views schematically illustrating a manufacturing method of a thin film transistor according to Embodiment 3.
Figure 7B:
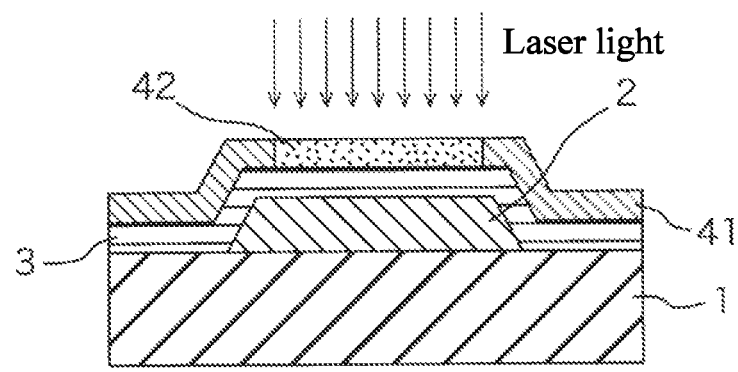
Figure 7C:
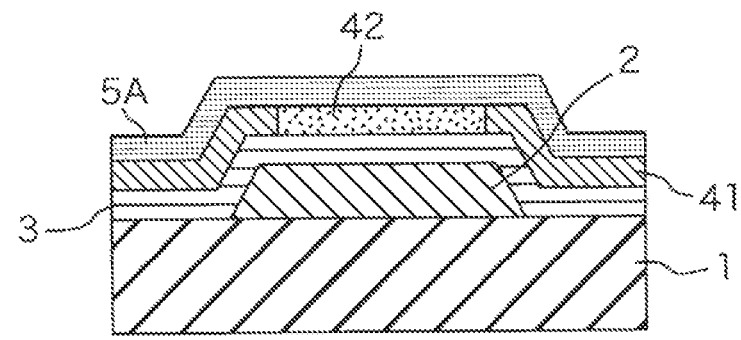
Figure 7D:
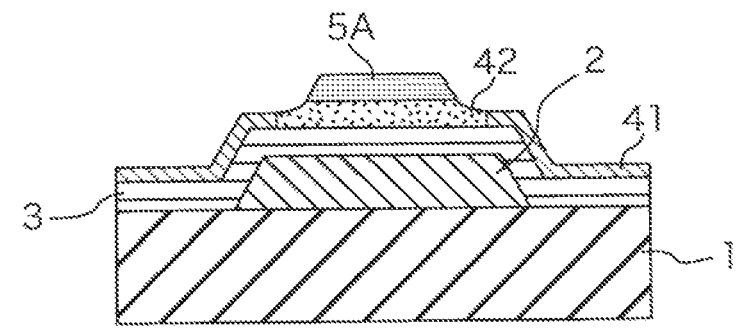
Figure 8:
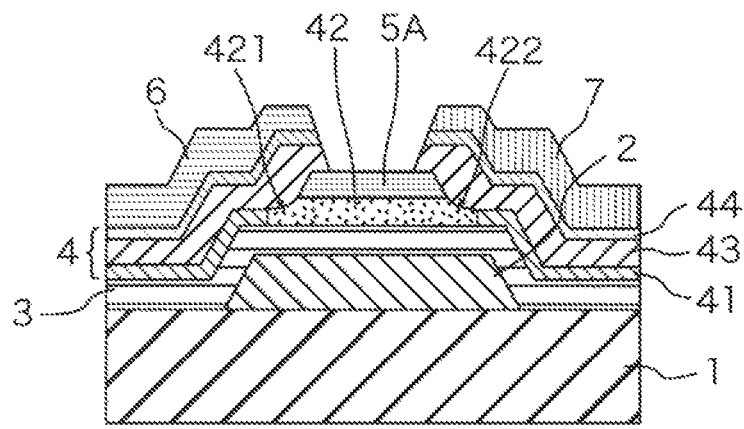
FIG. 8 is a cross-sectional view schematically illustrating the manufacturing method of the thin film transistor according to Embodiment 3.

FIGS. 7A to 8 are cross-sectional views schematically illustrating a manufacturing method of a thin film transistor according to Embodiment 3. First, a metal film is deposited by sputtering on the surface of the insulating substrate 1 such as a glass substrate using, as a material, a metal such as Al, Mo, Cr, Ta, Cu, and Ti, an alloy containing at least one of the metals as a main component, or a metal oxide. The gate electrode 2 is formed by patterning through photolithography with a photomask, dry etching of the metal film, photoresist removal, and washing.

Next, a film is deposited by CVD using a material such as $SiO_2$ and SiN to form the gate insulating film 3 so as to cover the gate electrode 2 on the substrate 1. Also, an amorphous silicon film having a thickness of approximately 500 to 700 Å is deposited by CVD to form the first amorphous silicon film 41 as an upper layer of the gate insulating film 3. FIG. 7A illustrates a phase in which the gate electrode 2, the gate insulating film 3, and the first amorphous silicon film 41 have been formed on the substrate 1.

Next, dehydrogenation is caused to give a hydrogen concentration of no greater than 2% in the first amorphous silicon film 41, and annealing is performed on the first amorphous silicon film 41 by irradiation within the range defined by the gate electrode 2 in a plan view with laser light (for example, energy beams such as from an excimer laser). As a result of the annealing, a portion of amorphous silicon in the first amorphous silicon film 41 turns polycrystalline silicon to form the polysilicon film 42 in the same layer as the first amorphous silicon film 41. FIG. 7B illustrates a phase in which the polysilicon film 42 has been formed.

Next, an $SiO_2$ film having a thickness of approximately 500 to 1,000 Å is deposited by CVD to form the etch stop layer 5A as an upper layer of the first amorphous silicon film 41 and the polysilicon film 42. FIG. 7C illustrates a phase in which the etch stop layer 5A has been formed.

Next, the etch stop layer 5A is formed insular through photolithography with a photomask, dry etching of the etch stop layer 5A, photoresist removal, and washing. The photolithography with a photomask is carried out and dry etching of the first amorphous silicon film 41 is also carried out so that the thickness of the first amorphous silicon film 41 is at least 250 Å and the polysilicon film 42 has regions that are not covered by the etch stop layer 5A (the polysilicon film 42 extends beyond the range of the etch stop layer 5A, according to the present embodiment). FIG. 7D illustrates a phase in which the insular etch stop layer 5A has been formed.

Next, an amorphous silicon film having a thickness of approximately 500 to 900 Å is deposited by CVD to form the second amorphous silicon film 43. An amorphous silicon film containing a high concentration of impurity such as phosphorus and arsenic is deposited by CVD to form the $n^+$ silicon film 44 as an upper layer of the second amorphous silicon film 43.

Next, a metal film is deposited by sputtering using, as a material, a metal such as Al, Mo, Cr, Ta, Cu, and Ti, an alloy containing at least one of the metals as a main component, or a metal oxide. The source electrode 6 and the drain electrode 7 are formed as an upper layer of the semiconductor layer 4 by patterning through photolithography with a photomask, dry etching of the metal film, photoresist removal, and washing. The photolithography with a photomask and the dry etching of the metal film are carried out so that the source electrode 6 and the drain electrode 7 in the upper layer of the semiconductor layer 4 are spaced, and the source electrode 6 and the drain electrode 7 are respectively located toward the region 421 and the region 422 that are not covered by the etch stop layer 5A of the polysilicon film 42. FIG. 8 illustrates a phase in which the source electrode 6 and the drain electrode 7 have been formed.

In order to apply the thin film transistor manufactured as described above to a liquid-crystal display apparatus as a switching element, a passivation film, an organic film, and a pixel electrode are formed in order as upper layers of the source electrode 6 and the drain electrode 7.

Although the present embodiment has been described referring to a configuration in which the etch stop layer 5A is formed insular through photolithography with a photomask, dry etching of the etch stop layer 5A, photoresist removal, and washing, the present embodiment may have a configuration in which the etch stop layer 5B having a contact hole structure is formed as in Embodiment 2.

Although the present embodiment has been described referring to a configuration in which the etch stop layer 5A is formed by depositing an $SiO_2$ film as the upper layer of the first amorphous silicon film 41 and the polysilicon film 42, the present embodiment may alternatively have a configuration in which the insular etch stop layer 5A or the etch stop layer 5B having a contact hole structure is formed by applying photosensitive spin on glass (SOG) as the upper layer of the first amorphous silicon film 41 and the poly-silicon film 42 and carrying out photolithography with a photomask. Such a configuration eliminates the need for the etching of the etch stop layer 5A or 5B, and thus further facilitates control of the film thickness in a contact section.

Embodiment 4

A display apparatus having a configuration adopting the thin film transistor according to any of the above-described embodiments is described as Embodiment 4.

Figure 9:
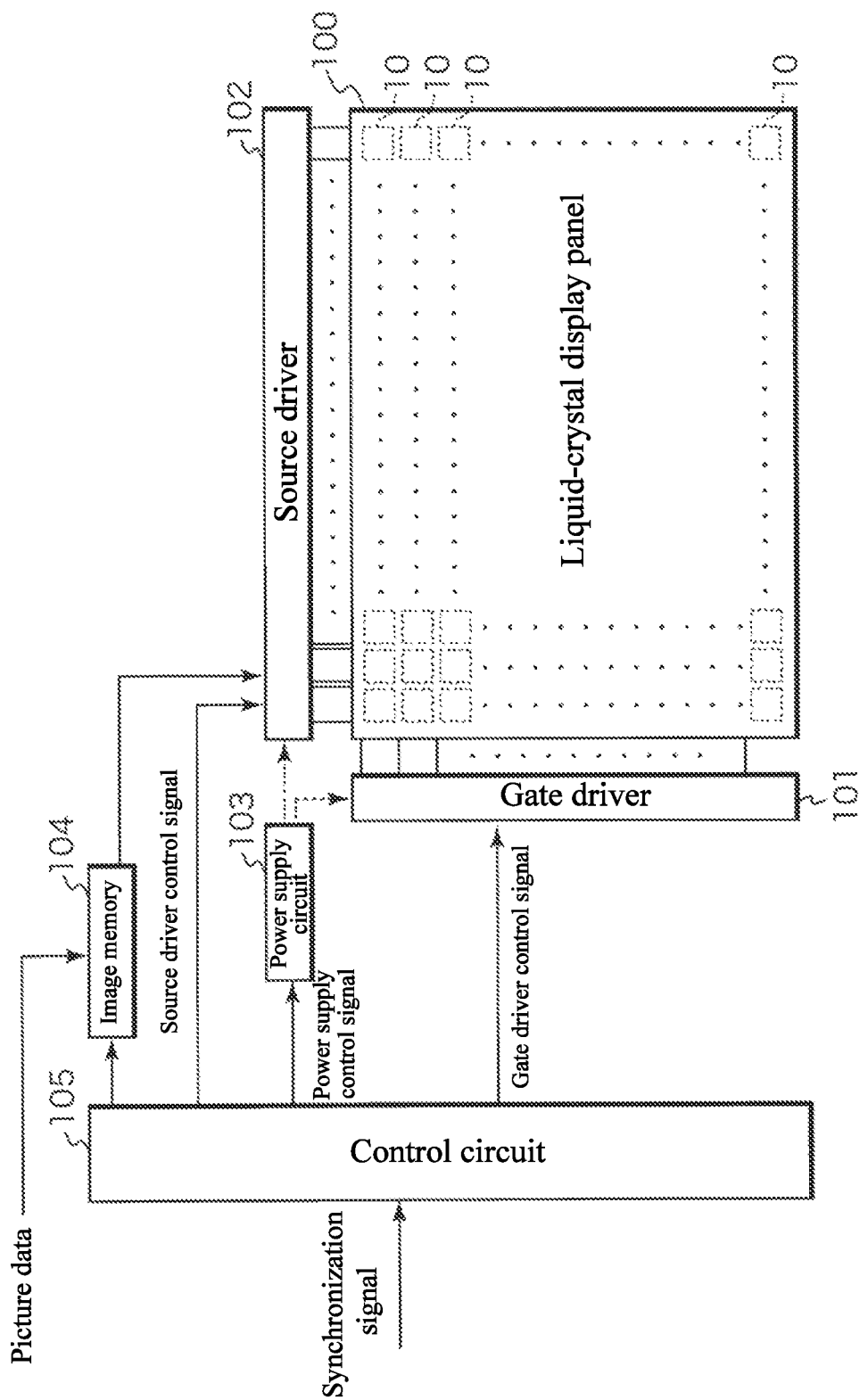
FIG. 9 is a block diagram illustrating a configuration of a display apparatus according to Embodiment 4.

FIG. 9 is a block diagram illustrating the configuration of the display apparatus according to Embodiment 4. The display apparatus illustrated in FIG. 9 is an example of a liquid-crystal display apparatus and includes a liquid-crystal display panel 100, a gate driver 101, a source driver 102, a power supply circuit 103, image memory 104, and a control circuit 105.

The control circuit 105 outputs control signals for separately controlling the gate driver 101, the source driver 102, the power supply circuit 103, and the image memory 104 in synchronization with an externally input synchronization signal.

The image memory 104 temporarily stores therein picture data of a display target and outputs the picture data to the source driver 102 in accordance with a memory control signal input from the control circuit 105. The image memory 104 may be incorporated in the control circuit 105 and configured to output the picture data to the source driver 102 after internal processing in the control circuit 105.

The power supply circuit 103 generates voltages such as a drive voltage for the gate driver 101 and a drive voltage for the source driver 102, and supplies the drive voltages to the gate driver 101 and the source driver 102, respectively, in accordance with a power supply control signal input from the control circuit 105.

The gate driver 101 generates a scanning signal for turning on or off switching elements 11 (see FIG. 10) of respective pixels 10 arranged in a matrix in the liquid-crystal display panel 100 and sequentially applies the generated scanning signal to gate lines connected to the gate driver in accordance with a gate driver control signal input from the control circuit 105.

The source driver 102 generates a data signal corresponding to the picture data input from the image memory 104 and sequentially applies the generated data signal to source lines connected to the source driver 102 in accordance with a source driver control signal input from the control circuit 105. The data signal applied by the source driver 102 through the source lines are written to pixels 10 for which corresponding switching elements 11 are on.

The present embodiment has been described referring to a configuration in which the gate driver 101 and the source driver 102 are provided externally to the liquid-crystal display panel 100. However, the present embodiment may alternatively have a configuration in which the gate driver 101 and the source driver 102 are mounted on a periphery of the liquid-crystal display panel 100.

Figure 10:
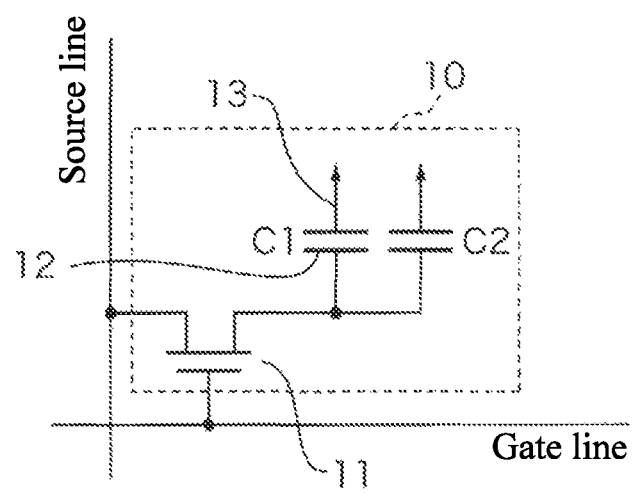
FIG. 10 is a circuit diagram illustrating an example of a configuration of each pixel.

FIG. 10 is a circuit diagram illustrating an example of a configuration of each pixel 10. Each pixel 10 includes a switching element 11 and a pixel electrode 12. The switching element 11 is for example the thin film transistor according to any of Embodiments 1 to 3. The source electrode 6 is connected to a source line and the drain electrode 7 is connected to the pixel electrode 12. The gate electrode 2 of the switching element 11 is connected to a gate line. The switching element 11 is switched between being on and being off in accordance with the scanning signal supplied to the gate line, and is capable of electrically disconnecting the pixel electrode 12 from the source line and electrically connecting the pixel electrode 12 to the source line.

The liquid-crystal display panel 100 includes a counter electrode 13 opposed to the pixel electrode 12. A liquid crystal substance is enclosed between the pixel electrode 12 and the counter electrode 13 thereby to form a liquid crystal capacitor C1. The counter electrode 13 is connected to a common voltage generator circuit, not shown, and is for example maintained at a fixed potential through application of a common voltage $V_{com}$ by the common voltage generator circuit.

Each pixel 10 includes a storage capacitor C2 parallelly connected with the liquid crystal capacitor C1. The storage capacitor C2 is also charged when a voltage is applied to the pixel electrode 12. Thus, a value of the voltage of the pixel 10 can be maintained by the fixed potential of the storage capacitor C2 even while no data voltage is applied through the corresponding source line.

The control circuit 105 of the liquid-crystal display apparatus controls the transmittance of the liquid crystal substance in each pixel 10 by controlling the magnitude of the voltage to be applied between the pixel electrode 12 and the counter electrode 13 through relevant elements such as the gate driver 101 and the source driver 102. Thus, the control circuit 105 adjusts the amount of light that passes through the liquid crystal substance for displaying a picture.

The use of the thin film transistor according to any of Embodiments 1 to 3 as the switching element 11 of each pixel 10 enables reduction of variation in characteristics among thin film transistors in the liquid-crystal display panel 100. It is therefore possible to maintain a good display quality of the liquid-crystal display panel 100.

Note that although the liquid-crystal display apparatus is described as an example of the display apparatus according to Embodiment 4, the display device according to Embodiment 4 may have a configuration including the thin film transistors according to any of Embodiments 1 to 3 as switching elements for pixel selection or as switching elements for pixel driving in an organic EL display.

The presently disclosed embodiments are merely examples in all aspects and should not be construed to be limiting. The scope of the present invention is indicated by the claims, rather than by the description given above, and includes all variations that are equivalent in meaning and scope to the claims.

REFERENCE SIGNS LIST

1 Substrate
2 Gate electrode
3 Gate insulating film
4 Semiconductor layer
5A, 5B Etch stop layer
6 Source electrode
7 Drain electrode
51, 52 Contact hole
421, 422 Region
423, 424 Region

The invention claimed is:

1. A method for manufacturing a thin film transistor, comprising:
    forming a gate electrode on a substrate;
    forming a gate insulating film to cover the gate electrode;
    forming an amorphous silicon film on the gate insulating film;
    forming an insulating film on the amorphous silicon film, the insulating film serving as an etch stop layer;
    forming a polysilicon layer in a first portion of the amorphous silicon film, while forming a first amorphous silicon layer in a second portion of the amorphous silicon film other than the first portion in the same layer as the polysilicon layer, by irradiating the first portion of the amorphous silicon film with energy beams from above through the insulating film, the first portion of the amorphous silicon film being located within a range defined by an outer edge of the gate electrode in a plan view;
    forming the etch stop layer by removing a portion of the insulating film so that the polysilicon layer includes a first region and a second region each not covered with the etch stop layer;
    forming a source electrode and a drain electrode with a space therebetween so that a part of one of the source electrode and the drain electrode is located over the first region and a part of another one of the source electrode and the drain electrode is located over the second region;
    forming a second amorphous silicon layer on the first and second regions of the polysilicon layer, the first amorphous silicon layer, and the etch stop layer after the forming of the etch stop layer; and
    forming an n$^+$ silicon layer on the second amorphous silicon layer.

2. The method for manufacturing a thin film transistor according to claim 1, wherein
    in the forming of the etch stop layer, the etch stop layer is formed so that the polysilicon layer protrudes outward from both sides of the etch stop layer in a direction in which the source electrode and the drain electrode are spaced.

3. The method for manufacturing a thin film transistor according to claim 2, wherein
    in the forming of the etch stop layer, the etch stop layer is formed so that the polysilicon layer protrudes at least 3 μm outward from the both sides of the etch stop layer in the direction in which the source electrode and the drain electrode are spaced.

4. The method for manufacturing a thin film transistor according to claim 1, wherein
    in the forming of the etch stop layer, the etch stop layer is formed so that a first opening and a second opening are formed in the etch stop layer to respectively expose the first region and the second region.

5. The method for manufacturing a thin film transistor according to claim 4, wherein
    in the forming of the etch stop layer, the etch stop layer is formed so that the first and second openings each have a width of at least 3 μm in a direction in which the source electrode and the drain electrode are spaced.

6. The method for manufacturing a thin film transistor according to claim 1, wherein
    in the forming of the etch stop layer, the etch stop layer is formed by removing the portion of the insulating film by carrying out etching on the insulating film.

7. The method for manufacturing a thin film transistor according to claim 1, wherein
    the insulating film is photosensitive spin on glass (SOG), and
    in the forming of the etch stop layer, the etch stop layer is formed by removing the portion of the insulating film by carrying out photolithography with a photomask on the insulating film.

8. The method for manufacturing a thin film transistor according to claim 1, wherein
in the forming of the etch stop layer, the etch stop layer is formed insularly so as to be located within a region defined by an outer edge of the gate electrode in a plan view.

9. A method for manufacturing a thin film transistor, comprising:
forming a gate electrode on a substrate;
forming a gate insulating film to cover the gate electrode;
forming an amorphous silicon film on the gate insulating film;
forming a polysilicon layer in a first portion of the amorphous silicon film, while forming a first amorphous silicon layer in a second portion of the amorphous silicon film other than the first portion in the same layer as the polysilicon layer, by irradiating the first portion of the amorphous silicon film with energy beams, the first portion of the amorphous silicon film being located within a range defined by an outer edge of the gate electrode in a plan view;
forming an insulating film on the polysilicon layer and the first amorphous silicon layer, the insulating film serving as an etch stop layer;
forming the etch stop layer by removing a portion of the insulating film so that the polysilicon layer includes a first region and a second region each not covered with the etch stop layer; and
forming a source electrode and a drain electrode with a space therebetween so that a part of one of the source electrode and the drain electrode is located over the first region and a part of another one of the source electrode and the drain electrode is located over the second region.

10. The method for manufacturing a thin film transistor according to claim 9, further comprising:
forming a second amorphous silicon layer on the first and second regions of the polysilicon layer, the first amorphous silicon layer, and the etch stop layer after the forming of the etch stop layer; and
forming an n⁺ silicon layer on the second amorphous silicon layer.

11. The method for manufacturing a thin film transistor according to claim 9, wherein
in the forming of the etch stop layer, the etch stop layer is formed so that the polysilicon layer protrudes outward from both sides of the etch stop layer in a direction in which the source electrode and the drain electrode are spaced.

12. The method for manufacturing a thin film transistor according to claim 11, wherein
in the forming of the etch stop layer, the etch stop layer is formed so that the polysilicon layer protrudes at least 3 μm outward from the both sides of the etch stop layer in the direction in which the source electrode and the drain electrode are spaced.

13. The method for manufacturing a thin film transistor according to claim 9, wherein
in the forming of the etch stop layer, the etch stop layer is formed so that a first opening and a second opening are formed in the etch stop layer to respectively expose the first region and the second region.

14. The method for manufacturing a thin film transistor according to claim 13, wherein
in the forming of the etch stop layer, the etch stop layer is formed so that the first and second openings each have a width of at least 3 μm in a direction in which the source electrode and the drain electrode are spaced.

15. The method for manufacturing a thin film transistor according to claim 9, wherein
in the forming of the etch stop layer, the etch stop layer is formed by removing the portion of the insulating film by carrying out etching on the insulating film.

16. The method for manufacturing a thin film transistor according to claim 9, wherein
the insulating film is photosensitive spin on glass (SOG), and
in the forming of the etch stop layer, the etch stop layer is formed by removing the portion of the insulating film by carrying out photolithography with a photomask on the insulating film.

17. The method for manufacturing a thin film transistor according to claim 9, wherein
in the forming of the etch stop layer, the etch stop layer is formed insularly so as to be located within a region defined by an outer edge of the gate electrode in a plan view.

* * * * *